(12) United States Patent
Lee et al.

(10) Patent No.: US 9,159,422 B1
(45) Date of Patent: Oct. 13, 2015

(54) CROSS PAGE MANAGEMENT TO AVOID NAND PHYSICAL PAGE SIZE LIMITATION

(75) Inventors: Meng-Kun Lee, Cupertino, CA (US); Priyanka Thakore, San Jose, CA (US); Derrick Preston Chu, Santa Clara, CA (US)

(73) Assignee: SK hynix memory solutions inc., San Jose, CA (US)

( * ) Notice: Subject to any disclaimer, the term of this patent is extended or adjusted under 35 U.S.C. 154(b) by 715 days.

(21) Appl. No.: 13/445,139

(22) Filed: Apr. 12, 2012

Related U.S. Application Data

(60) Provisional application No. 61/474,684, filed on Apr. 12, 2011.

(51) Int. Cl.
*G11C 29/18* (2006.01)
*G11C 16/04* (2006.01)
*G11C 16/10* (2006.01)

(52) U.S. Cl.
CPC .............. *G11C 16/04* (2013.01); *G11C 16/107* (2013.01)

(58) Field of Classification Search
CPC ...................... G11C 7/1021; G11C 2013/0085; G11C 2216/14; G11C 2029/1806
USPC .................. 365/185.12, 235, 238.5
See application file for complete search history.

(56) References Cited

U.S. PATENT DOCUMENTS

| 2007/0005627 | A1* | 1/2007 | Dodge | 707/101 |
|---|---|---|---|---|
| 2007/0143561 | A1* | 6/2007 | Gorobets | 711/170 |
| 2007/0143566 | A1* | 6/2007 | Gorobets | 711/202 |
| 2008/0192539 | A1* | 8/2008 | Choi et al. | 365/185.03 |
| 2008/0195822 | A1* | 8/2008 | Yang et al. | 711/155 |
| 2010/0088557 | A1* | 4/2010 | Weingarten et al. | 714/704 |
| 2010/0241790 | A1* | 9/2010 | Whang et al. | 711/103 |
| 2013/0246891 | A1* | 9/2013 | Manning et al. | 714/773 |
| 2014/0325179 | A1* | 10/2014 | Yang et al. | 711/206 |

* cited by examiner

*Primary Examiner* — Vanthu Nguyen
*Assistant Examiner* — Khamdan Alrobaie
(74) *Attorney, Agent, or Firm* — Van Pelt, Yi & James LLP (57) ABSTRACT

A method of writing data to non-volatile computer storage is disclosed. A logical page of data is received and stored in an intermediate storage. A first portion of the logical page is read from the intermediate storage and written to a first physical page in the non-volatile computer storage. A second portion of the logical page is read from the intermediate storage and written to a second physical page in the non-volatile computer storage. A method of reading data from non-volatile computer storage is disclosed. A first portion of a logical page is read from a first physical page in the non-volatile computer storage and written in an intermediate storage. A second portion of the logical page is read from a second physical page and written in the intermediate storage. The first portion and the second portion of the logical page are concatenated to form the logical page.

18 Claims, 10 Drawing Sheets

CROSS PAGE MANAGEMENT TO AVOID NAND PHYSICAL PAGE SIZE LIMITATION

CROSS REFERENCE TO OTHER APPLICATIONS

This application claims priority to U.S. Provisional Patent Application No. 61/474,684 entitled CROSS PAGE MANAGEMENT TO AVOID NAND PHYSICAL PAGE SIZE LIMITATION filed Apr. 12, 2011 which is incorporated herein by reference for all purposes.

BACKGROUND OF THE INVENTION

In a storage media device system, data is typically read from NAND flash devices, and then the read data is processed by a decoder. For example, the decoder may be an error-correcting code (ECC) decoder enabling reconstruction of the original error-free data. Data retention is the ability of a memory bit to retain its data state over long periods of time. The data retention of NAND flash devices may be limited by charge leaking from the floating gates of the memory cell transistors. Furthermore, leakage is accelerated by high temperature or radiation. Program-erase cycles (P/E cycles) can also degrade a NAND flash device. Therefore, improved techniques that support a flexible error correction scheme for correcting the errors in data read from NAND flash devices would be desirable.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
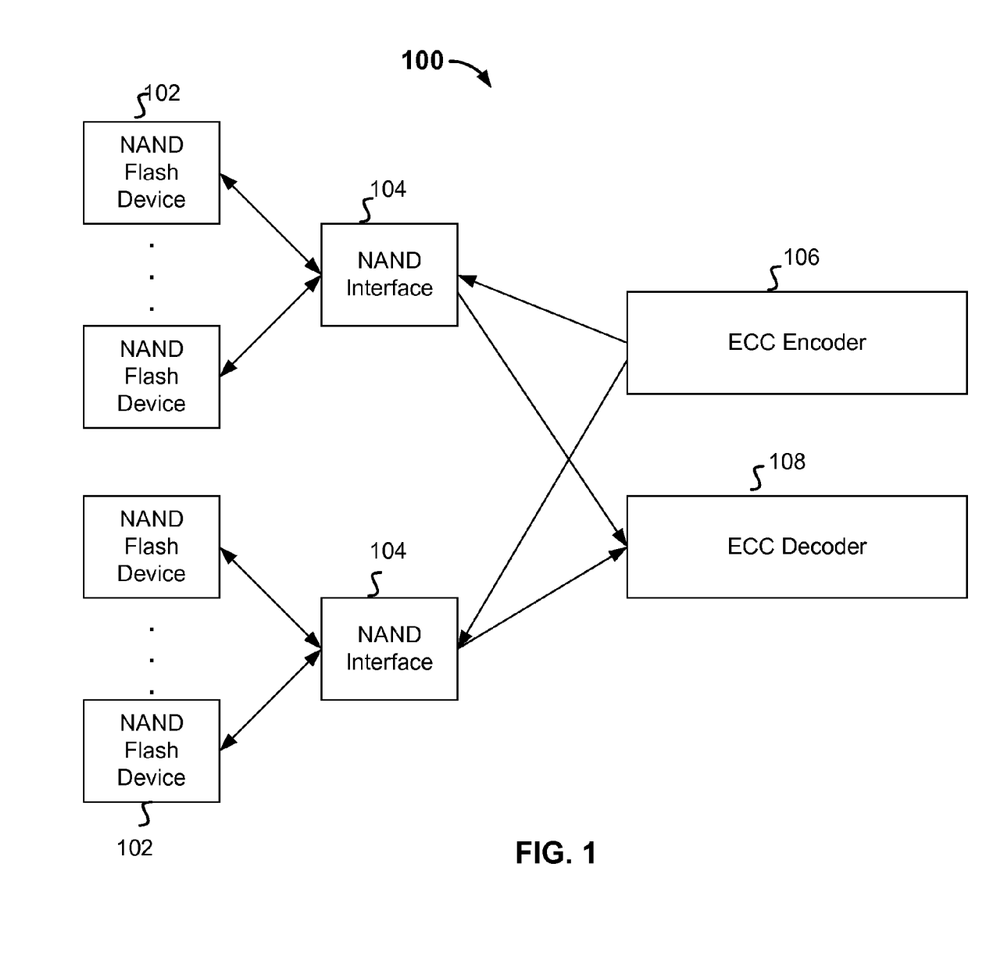
FIG. 1 is a block diagram illustrating an embodiment of a storage media device system 100.

FIG. 1 is a block diagram illustrating an embodiment of a storage media device system 100. Storage media device system 100 includes one or more non-volatile computer storage chips 102, such as NAND flash devices 102. In the present patent application, NAND flash devices are selected as illustrative examples only. The techniques disclosed herein may apply to other computer storage chips as well; accordingly, the present application is not limited to the specific example of NAND flash devices only.

Storage media device system 100 also includes a computer storage chip interface 104, such as a NAND flash interface 104, which provides an interface to NAND flash devices 102. For example, a NAND flash interface 104 provides an interface for NAND flash devices 102 to identify themselves and describe their capabilities. It also provides an interface for storage media device system 100 to perform commands, including reading, programming, erasing, and register changes on the NAND flash devices 102.

For example, when storage media device system 100 writes user data to one of the NAND flash devices 102, an encoder 106 determines a plurality of parity bits for error correction of the user data. Encoder 106 then sends the user data and the corresponding parity bits to a NAND flash interface 104, and the NAND flash interface 104 will in turn write the user data and the parity bits to the NAND flash device 102. In another example, when storage media device system 100 sends a read command via a NAND flash interface 104 to one of the NAND flash devices 102, the NAND flash device 102 will send the read data to the NAND flash interface 104, and the NAND flash interface 104 will in turn send the read data to a decoder 108. For example, decoder 108 may be an error-correcting code (ECC) decoder enabling reconstruction of the original error-free data initially stored in the NAND flash device 102. In some embodiments, ECC decoder 108 is a BCH decoder. In some embodiments, ECC decoder 108 is a low-density parity-check (LDPC) decoder. In various embodiments, LDPC decoder 108 may be implemented using various algorithms, including the sum-product algorithm, min-sum algorithm, and brief propagation algorithm.

Data retention is the ability of a memory bit to retain its data state over long periods of time. The data retention of NAND flash devices is limited by various factors. The cell voltage level of a NAND flash device can decay or otherwise leak under certain circumstances. For example, after data is programmed onto a NAND flash device, the cell voltage levels slowly drift down after a period of time, typically months or years, because charge may slowly leak from the floating gates of the memory cell transistors. Furthermore, the speed of such voltage drift can be accelerated when the NAND flash device is kept in a high temperature environment for long hours or if many program-erase cycles have been performed on the NAND flash device. Because of the above factors, the number of bit flips in the data stored in a NAND flash device increases over time. When the number of bit flips is beyond the error-correcting capability of the ECC decoder, the life span of the NAND flash device will have been reached.

Figure 2:
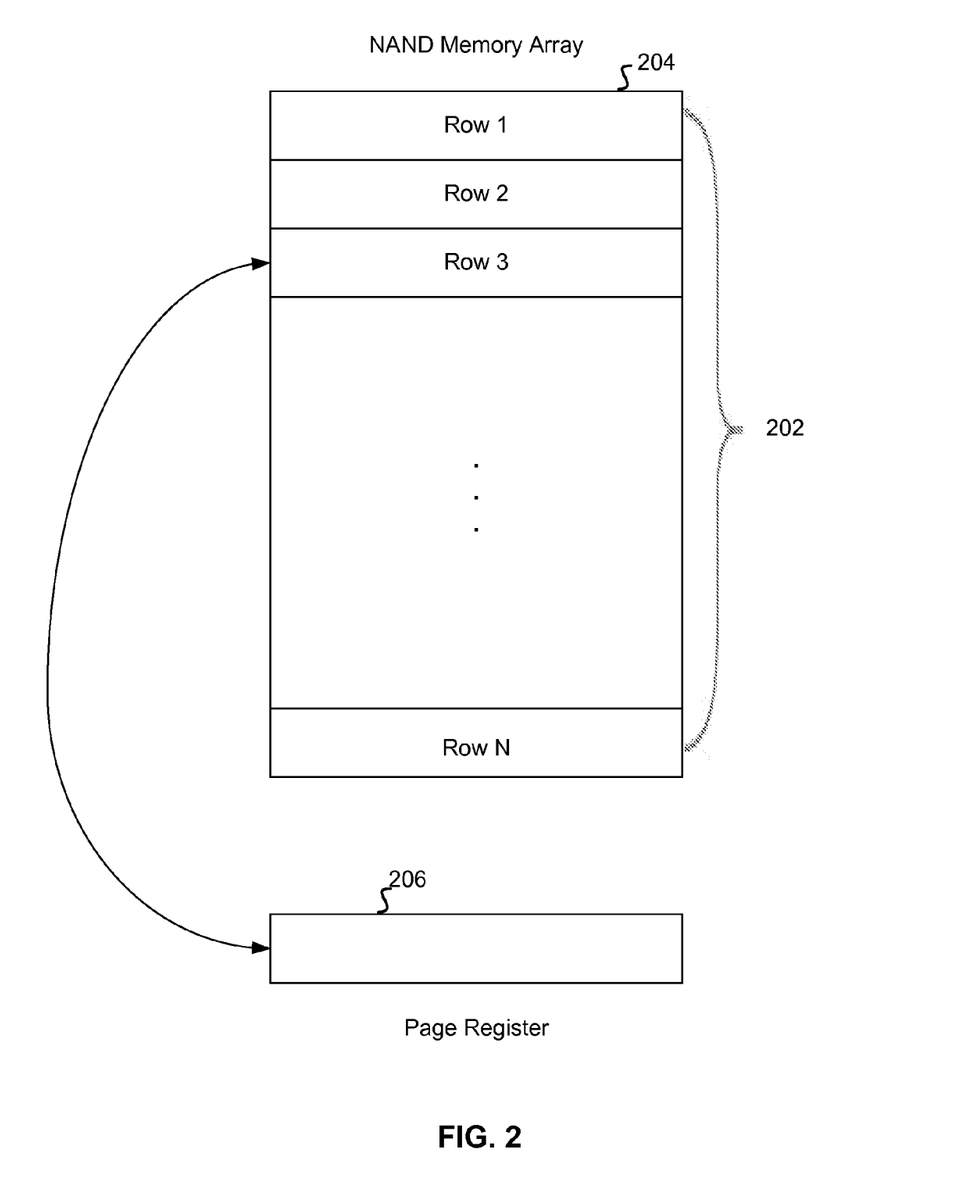
FIG. 2 is a diagram illustrating an embodiment of a NAND memory array and a NAND page register of a NAND flash device.

FIG. 2 is a diagram illustrating an embodiment of a NAND memory array and a NAND page register of a NAND flash device. A NAND flash device includes a NAND memory array 202 and a NAND page register 206. The reading and programming of the NAND flash device is performed on a page-by-page basis, a page being the smallest unit of physical space that can be read from or programmed into the NAND flash device at one time. As shown in FIG. 2, to write data onto NAND memory array 202, data is first written to NAND page register 206, which has a size of one physical page. The physical page of data in NAND page register 206 is then programmed into one of the rows 204 in NAND memory array 202.

Figure 3:
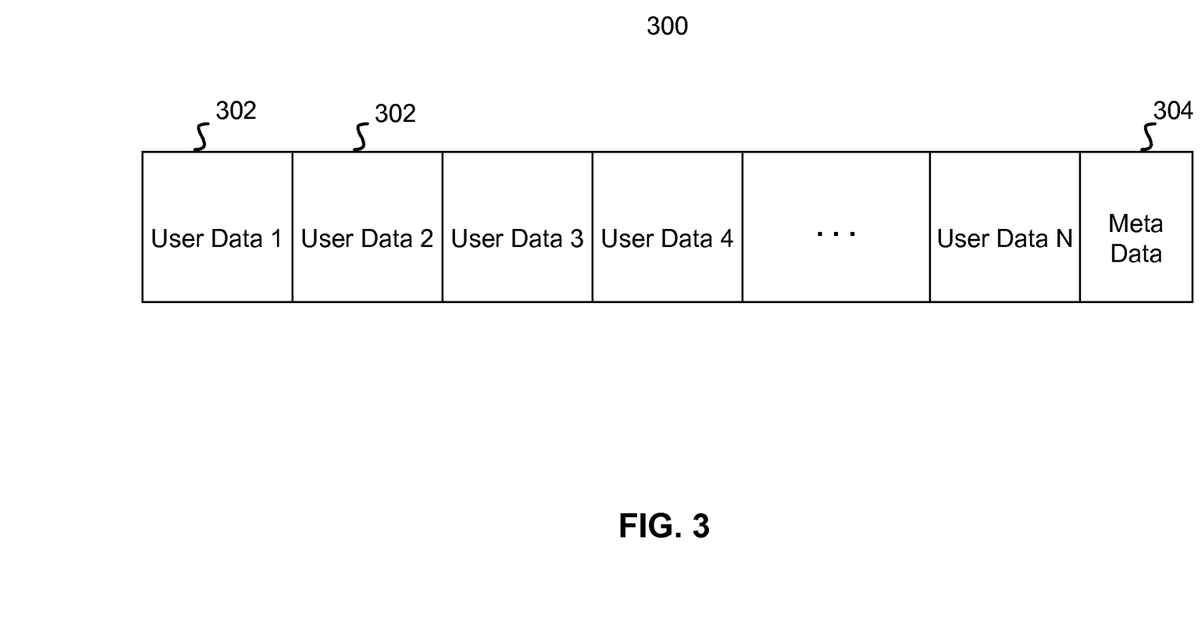
FIG. 3 is a diagram illustrating an embodiment of a physical page 300 of a NAND flash device.

FIG. 3 is a diagram illustrating an embodiment of a physical page 300 of a NAND flash device. Physical page 300 can be divided into one or more user data units 302 and a meta data area 304. The size of the one or more user data units 302, the number of user data units 302 in physical page 300, and the size of meta data area 304 are determined by the particular NAND manufacturer and may differ for different NAND manufacturers. User data units 302 are used for storing user data. In some NAND flash devices, the size of each user data unit 302 in bytes is a power of two, such as 512, 2048, or 4096 bytes in size. Meta data area 304 can be used for storing error correcting information, such as parity bits. Meta data area 304 can also be used for storing other information, including decoding information, firmware assistance information, and the like. In some NAND flash devices, the size of meta data area 304 is determined by the NAND manufacturer based on a target life span of the NAND flash device. For example, a NAND manufacturer may determine that to achieve a particular target life span (e.g., a target life span measured in P/E cycles) based on the NAND flash device's error correcting requirements, an ECC decoder would require y number of parity bits for error-correcting each Kbytes of user data. Then meta data area 304 may be determined as a function of y. For example, the NAND manufacturer may determine that the size of meta data area 304 may be set to be equal to y* the number of Kbytes of user data (the product being measured in bits)+z number of bytes for storing other types of information.

Figure 4:
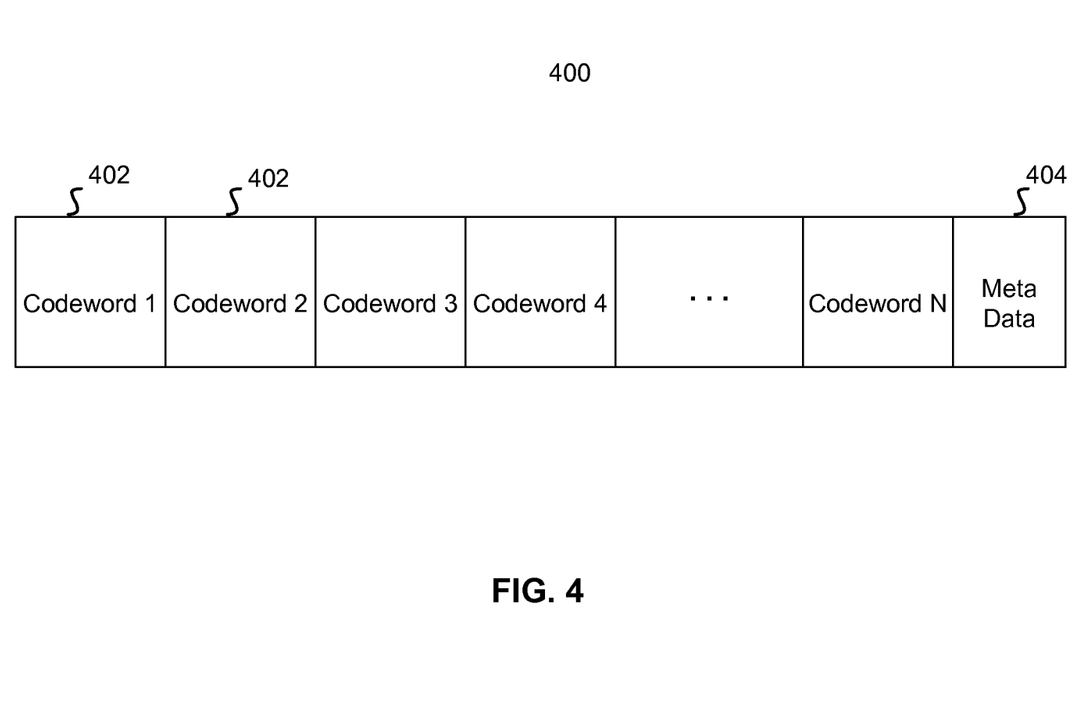
FIG. 4 is a diagram illustrating an embodiment of a logical page 400 output by an ECC encoder.

FIG. 4 is a diagram illustrating an embodiment of a logical page 400 output by an ECC encoder. In some embodiments, logical page 400 includes one or more codewords 402 and a meta data area 404. The size of codewords 402 is determined by the ECC encoder. For example, the size of codewords 402 can be any arbitrary number of bytes, such as 512 bytes, 520 bytes, 528 bytes, and the like. Meta data area 404 can be used for storing error correcting information, such as parity bits. Meta data area 404 can also be used for storing other types of information, including decoding information, firmware assistance information, and the like.

In some embodiments, the ECC encoder forces the logical page size to be equal to or less than the physical page size of the NAND flash devices. However, fixing the logical page size to be equal to or less than the physical page size has a number of drawbacks. First, the ECC capability of the system is not determined by the storage media device system but is bounded by the size of meta data area 304, which is dictated by the NAND manufacturer. For example, a higher number of parity bits cannot be allocated to increase the ECC capability of the system, and thus the expected life span of the system, unless some of the physical space originally budgeted for user data is used for storing the extra parity bits instead; in such case the capacity or code rate of the system will be reduced.

Second, the memory space of the NAND flash device may not be fully utilized due to the constant nature of the physical page size and thus the logical page size. In some applications, the codeword sizes may not be equal to the size of the user data units designed by the NAND manufacturers. For example, the user data unit size may be 512 bytes, while the codeword size is 520 bytes. Since the codeword size is larger than the user data unit size, fewer codewords may be fitted into the page, and some of the memory space in the page will not be used.

Third, swapping NAND flash devices is not transparent to the encoder. For example, if 4 k page NAND flash devices are used to replace 8 k page NAND flash devices in a storage media device system, the encoder needs to be modified such that it writes logical pages having a size that matches with the physical page size of the new 4 k page NAND flash devices.

In some embodiments, the ECC encoder is configured to output logical pages with a size that is independent of the physical page size of the NAND flash devices. The codeword size is also independent of the physical page size of the NAND flash devices. For example, if the physical page size is equal to N bytes, then the logical page size is equal to M, where M may be greater than, equal to, or smaller than N.

Figure 5:
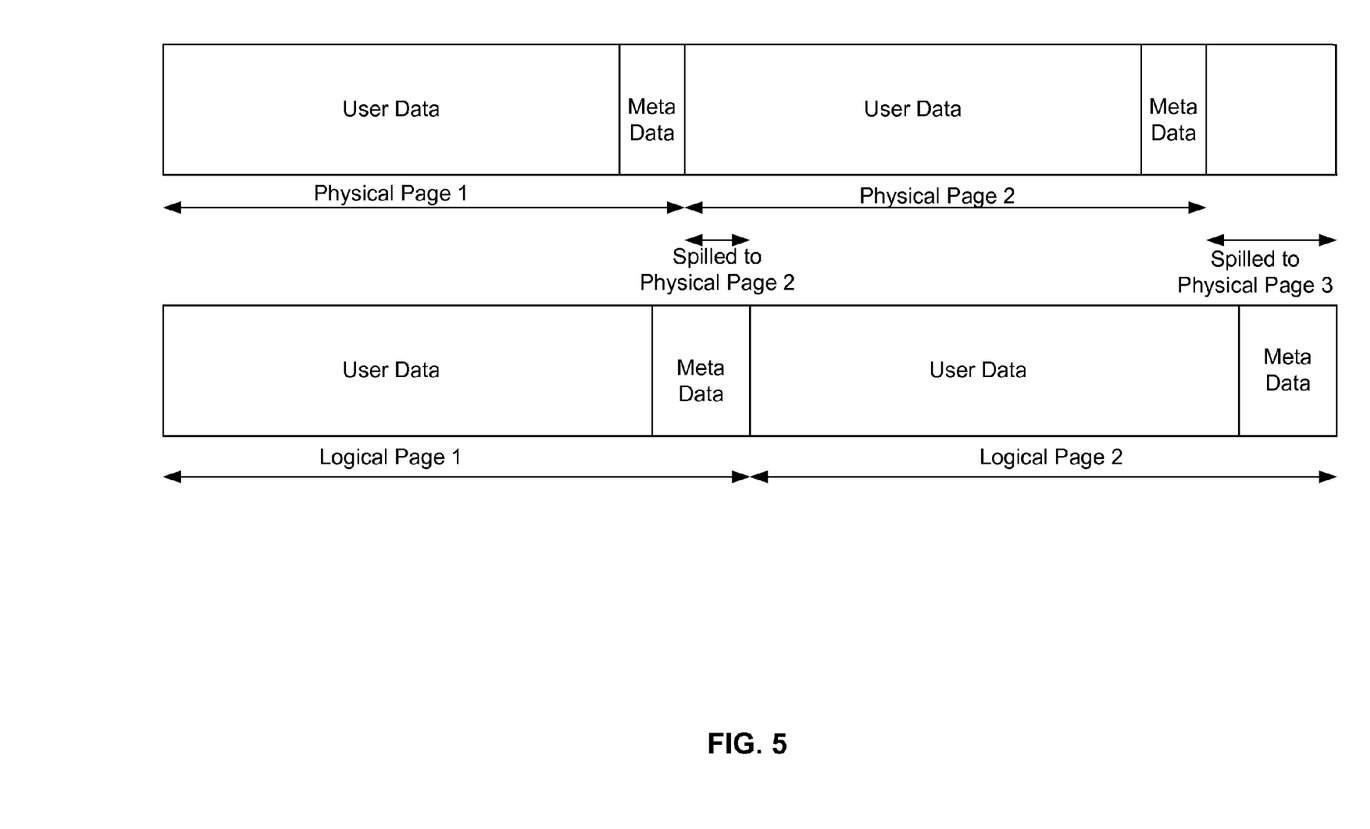
FIG. 5 is a diagram illustrating an embodiment of a logical page having a page size that is greater than the physical page size.

FIG. 5 is a diagram illustrating an embodiment of a logical page having a page size that is greater than the physical page size. As shown in FIG. 5, when logical page 1 is greater than that which can fit into physical page 1, the remainder of logical page 1 is stored in physical page 2. A ECC codeword can be programmed across multiple NAND physical pages.

Figure 6:
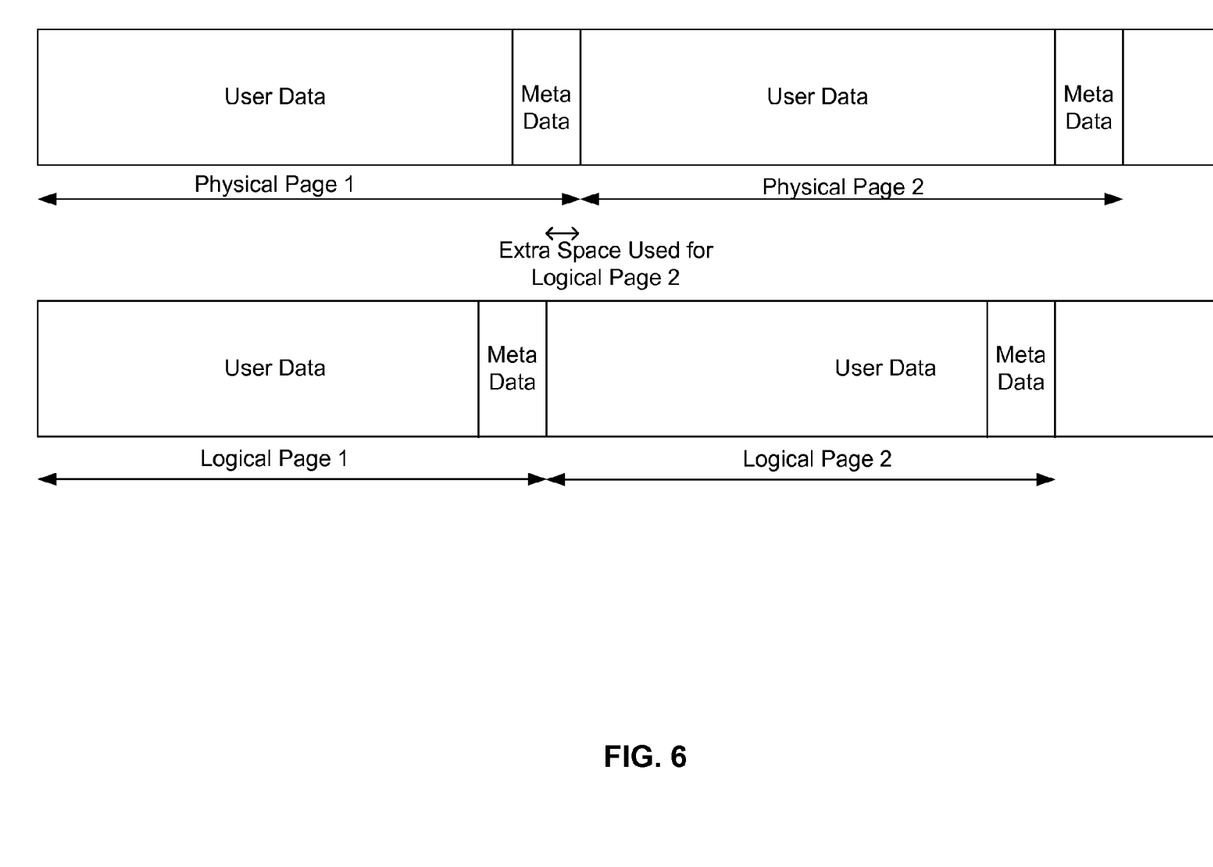
FIG. 6 is a diagram illustrating an embodiment of a logical page having a page size that is smaller than the physical page size.

FIG. 6 is a diagram illustrating an embodiment of a logical page having a page size that is smaller than the physical page size. As shown in FIG. 6, the extra space left in physical page 1 is used to store logical page 2, which will allow the whole NAND physical page to be fully utilized without wasting bytes on account of the larger granularity of a physical page. Note that a first portion of logical page 2 is stored in physical page 1, and the remainder of logical page 2 is stored in physical page 2. Thus a logical page can be programmed across multiple NAND physical pages.

As illustrated in FIG. 5 and FIG. 6, because there is no relation between the size of the physical page and the size of the data to be programmed to the NAND (i.e., the size of user data+parity bits+other meta information belonging to a logical page), each bit of the physical page memory can be utilized. The ECC encoder is also free to allocate the appropriate number of parity bits for error-correction based on other requirements and specifications. For example, the ECC encoder may allocate a higher number of parity bits to increase the ECC capability and thus the expected lifespan of the system. In addition, swapping NAND flash devices no longer requires the design of the ECC encoder to be changed because the logical page size may remain unchanged.

Figure 7:
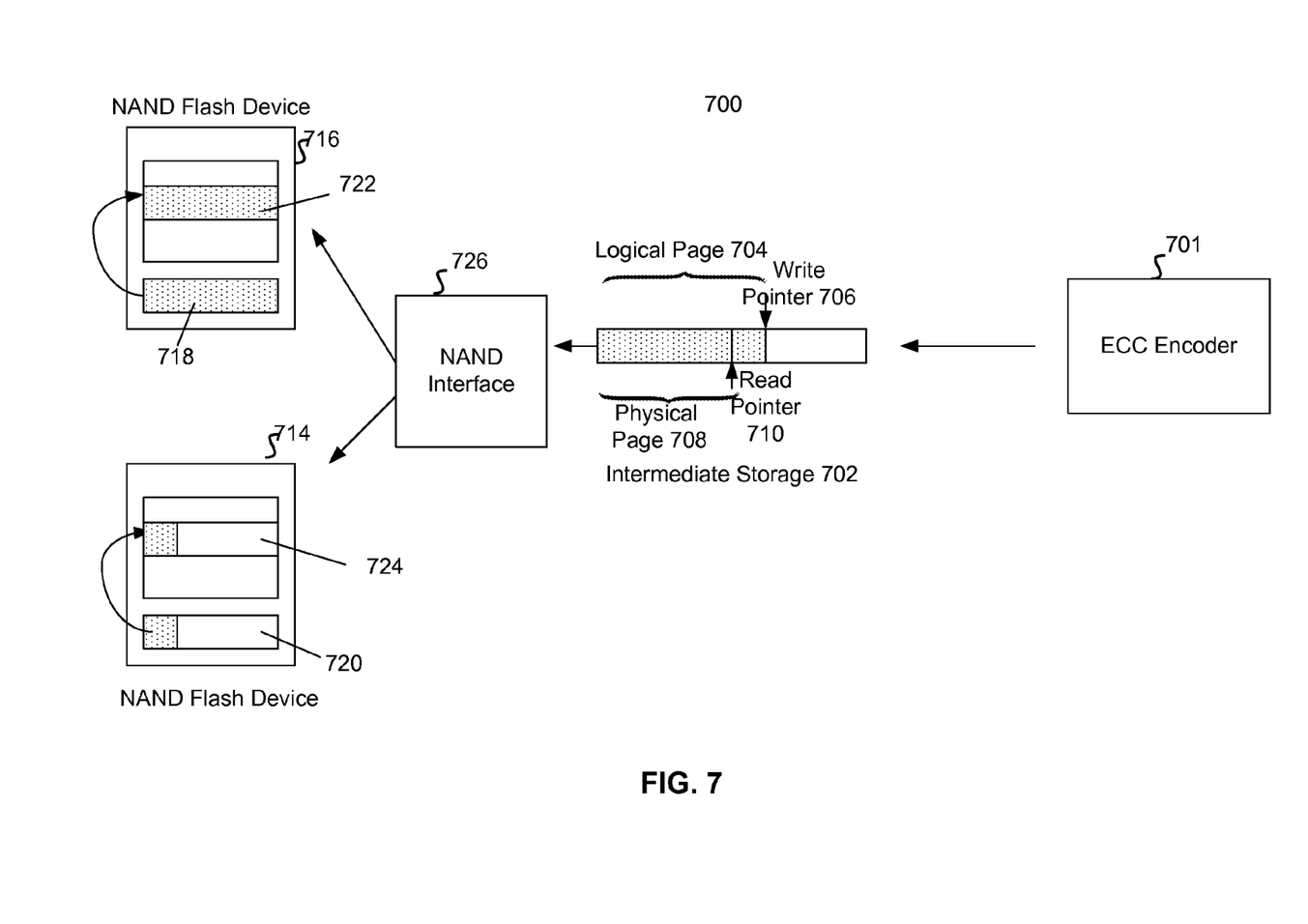
FIG. 7 is a block diagram illustrating an embodiment of a storage media device system 700 when the system is writing data to one or more NAND flash devices.

FIG. 7 is a block diagram illustrating an embodiment of a storage media device system 700 when the system is writing data to one or more NAND flash devices. Storage media device system 700 is similar to storage media device system 100 as shown in FIG. 1, including one or more NAND flash devices (714 and 716), one or more NAND flash interfaces 726, and an ECC encoder 701. Storage media device system 700 further includes an intermediate storage 702. Intermediate storage 702 is used to temporarily store a logical page 704 that is output by ECC encoder 701 before the logical page 704 is written to the one or more NAND flash devices (714 and 716) via NAND flash interface 726. As will be described in greater detail below, the temporary storage of a logical page 704 in intermediate storage 702 allows ECC encoder 701 to write logical pages with a logical page size that is independent from the physical page size of NAND flash devices (714 and 716).

In some embodiments, intermediate storage 702 may be a circular buffer. As logical page 704 is being written to intermediate storage 702, a write pointer 706 is advanced to point to the next location within intermediate storage 702 to be written to. When write pointer 706 points to the end of the circular buffer, write pointer 706 wraps around and writes to the beginning of the circular buffer again. As soon as the writing of logical page 704 to intermediate storage 702 commences, a read pointer 710 that always lags behind write pointer 706 may be used to read logical page 704 from intermediate storage 702 and send it to the one or more NAND flash devices (714 and 716) via NAND interface 726. As shown in FIG. 7, the size of logical page 704 is greater than the size of physical page 708. As a result, one portion of logical page 704 having a size equal to one physical page is written to a page register 718 and then transferred from page register 718 to a row 722 of a NAND memory array on NAND flash device 716. The remaining portion of logical page 704 is written to a page register 720 and then transferred from page register 720 to a row 724 of a NAND memory array on NAND flash device 714. Alternatively, the content of page register 720 is not transferred until page register 720 is filled by subsequent writes. Note that in this specific example, one logical page is written to two different NAND flash devices. In some embodiments, the logical page is written to two different NAND flash devices in parallel. Alternatively, the logical page may be written to two rows of the NAND memory array of the same NAND flash device.

Figure 8:
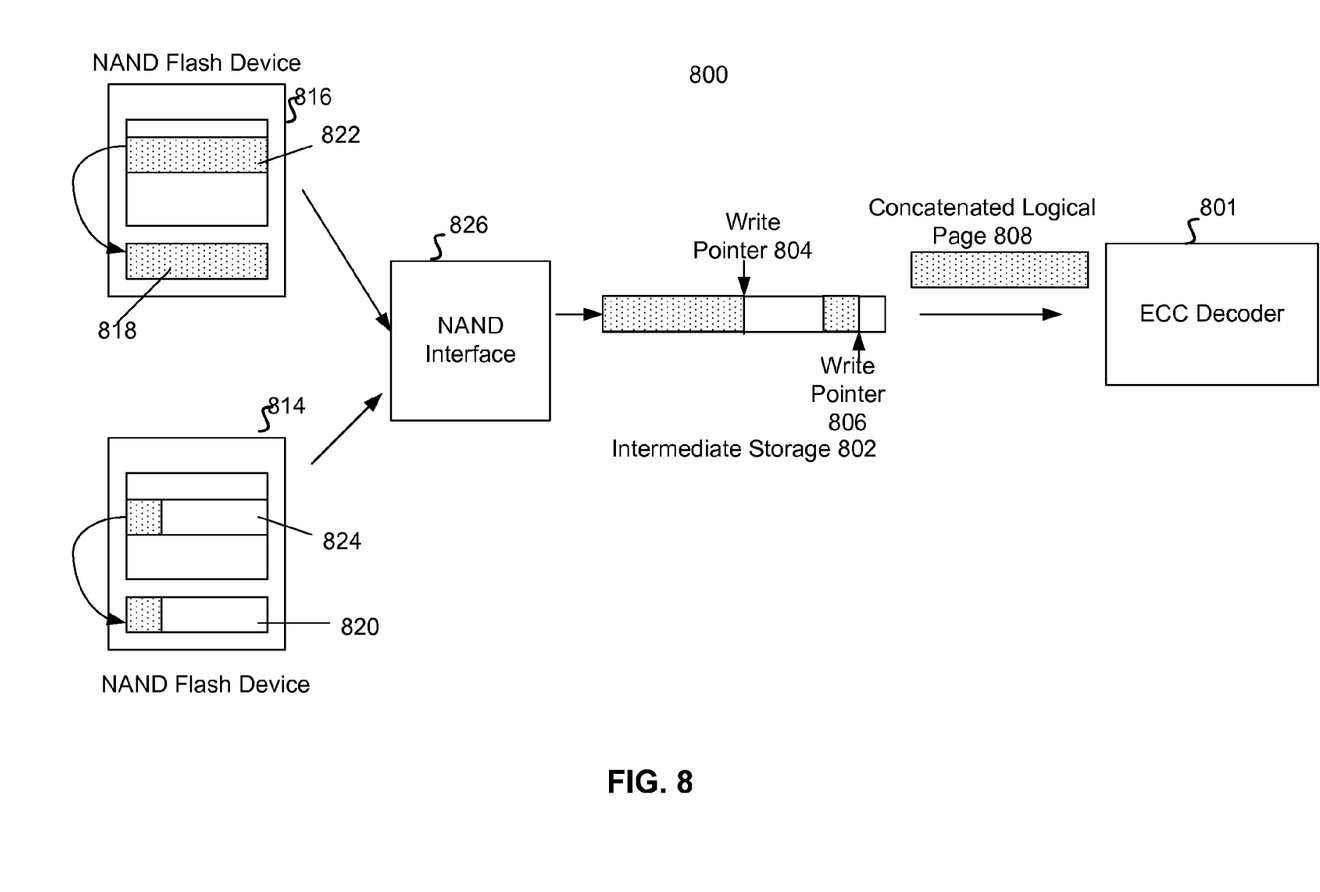
FIG. 8 is a block diagram illustrating an embodiment of a storage media device system 800 when the system is reading data back from the one or more NAND flash devices to ECC decoder 801.

FIG. 8 is a block diagram illustrating an embodiment of a storage media device system 800 when the system is reading data back from the one or more NAND flash devices to ECC decoder 801. Continuing with the previous example (as shown in FIG. 7) in which the size of the logical page is greater than the size of the physical page, the first portion of the logical page is read from a first physical page stored on a NAND flash device, and the second portion of the logical page is read from a second physical page stored on another NAND flash device or the same NAND flash device. For example, as shown in FIG. 8, the first portion of the logical page is read from a row 822 of a NAND memory array on NAND flash device 816 to a page register 818, and the second portion of the logical page is read from a row 824 of a NAND memory array on NAND flash device 814 to a page register 820. The first portion of the logical page is then transferred from page register 818 to an intermediate storage 802 via a NAND interface 826 using a write pointer 804. Similarly, the second portion of the logical page is transferred from page register 820 to intermediate storage 802 using a write pointer 806. Note that page register 820 may include user data and/or meta data corresponding to another logical page. If the system determines that these user data and/or meta data is going to be read by ECC decoder soon, then they will be transferred from page register 820 to intermediate storage 802 at the same time as well.

With continued reference to FIG. 8, the first portion and the second portion of the logical page are then concatenated to form a concatenated logical page 808 that is sent to ECC decoder 801 to be decoded. Note that in this specific example, one logical page is read from two different NAND flash devices. In some embodiments, the first portion and the second portion of the logical page is read from two different NAND flash devices in parallel. Alternatively, the logical page may be read from two rows of the NAND memory array of the same NAND flash device.

Figure 9:
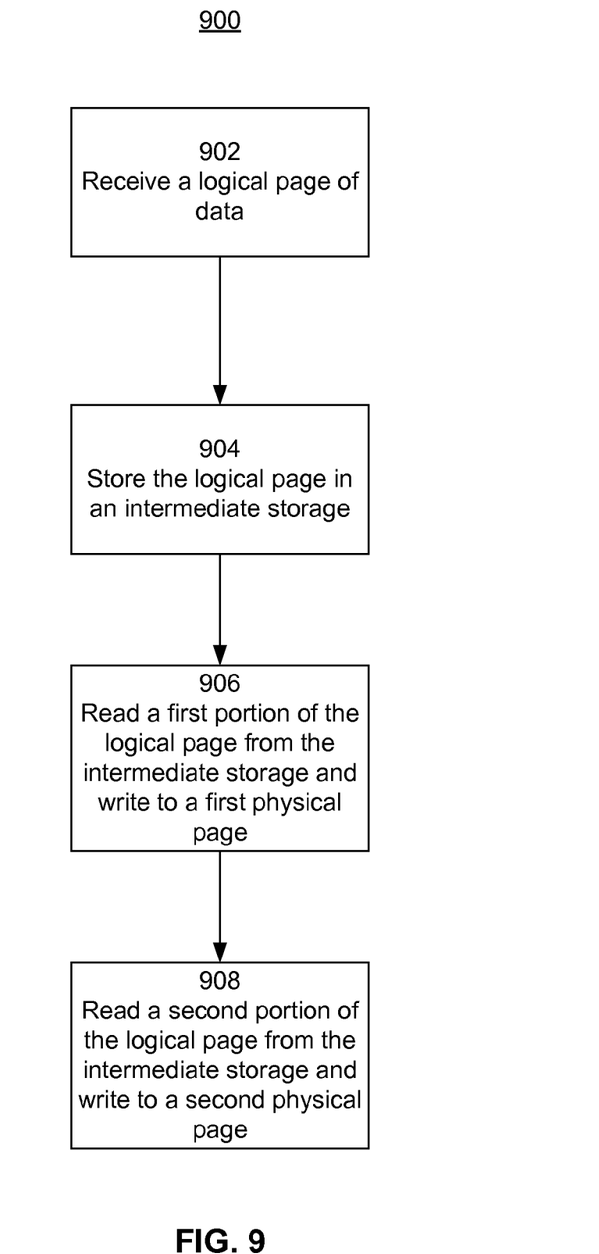
FIG. 9 is a flow diagram illustrating an embodiment of a process 900 for writing data to non-volatile computer storage, e.g., NAND flash devices.

FIG. 9 is a flow diagram illustrating an embodiment of a process 900 for writing data to non-volatile computer storage, e.g., NAND flash devices. In some embodiments, process 900 is a process performed by storage media device system 700 shown in FIG. 7. At 902, a logical page of data is received from an ECC encoder. At 904, the logical page of data is stored in an intermediate storage. At 906, a first portion of the logical page is read from the intermediate storage. The first portion of the logical page is written to a first physical page in the non-volatile computer storage. At 908, a second portion of the logical page is read from the intermediate storage. The second portion of the logical page is written to a second physical page in the non-volatile computer storage.

Figure 10:
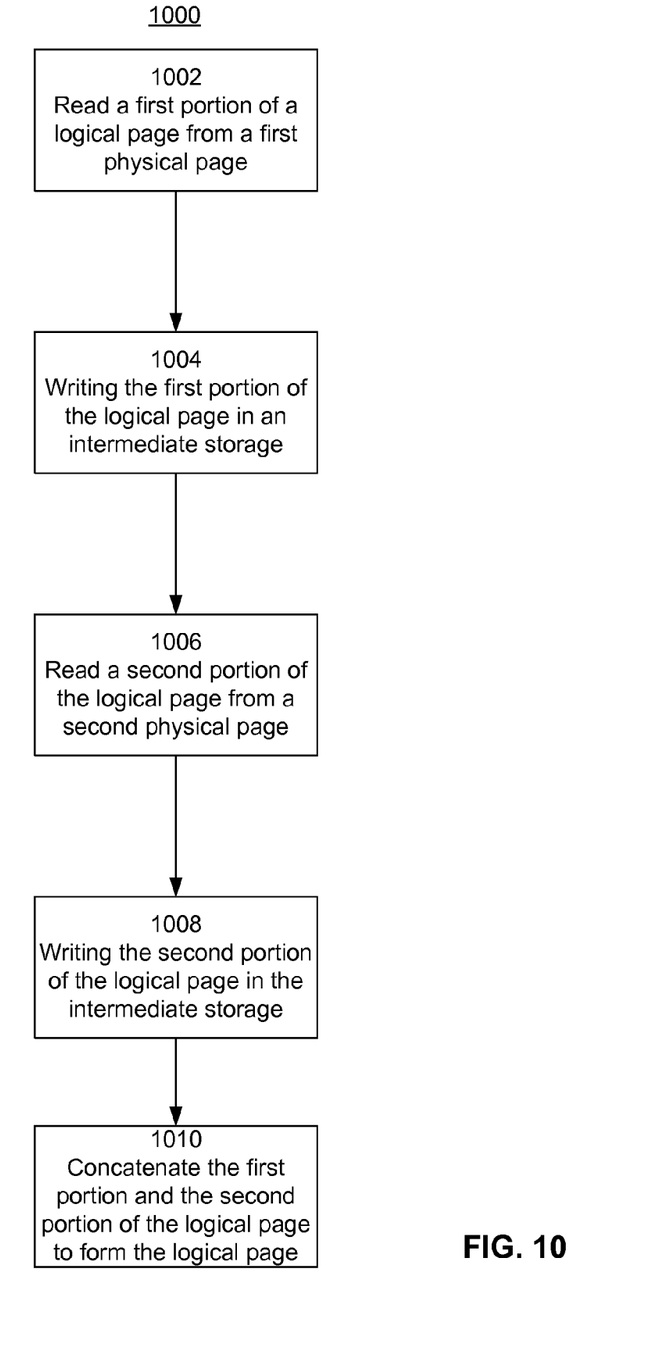
FIG. 10 is a flow diagram illustrating an embodiment of a process 1000 for reading data from non-volatile computer storage, e.g., NAND flash devices.

FIG. 10 is a flow diagram illustrating an embodiment of a process 1000 for reading data from non-volatile computer storage, e.g., NAND flash devices. In some embodiments, process 1000 is a process performed by storage media device system 800 shown in FIG. 8. At 1002, a first portion of a logical page is read from a first physical page. At 1004, the first portion of the logical page is written to an intermediate storage. At 1006, a second portion of the logical page is read from a second physical page. At 1008, the second portion of the logical page is written to the intermediate storage. At 1010, the first portion and the second portion of the logical page are concatenated to form the logical page. The concatenated logical page is then sent to an ECC decoder for decoding. The reading from two physical pages can also occur at the same time to form a logical page in the intermediate storage.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of writing data to non-volatile computer storage, comprising:
   receiving a logical page of data;
   storing the logical page of data in an intermediate storage;
   reading a first portion of the logical page from the intermediate storage;
   reading a second portion of the logical page from the intermediate storage; and
   writing the first portion of the logical page to a first physical page in the non-volatile computer storage and writing the second portion of the logical page to a second physical page in the non-volatile computer storage; wherein the non-volatile computer storage includes two or more NAND flash devices, and wherein the writing of the first portion of the logical page and the writing of the second portion of the logical page are performed in parallel to two NAND flash devices.

2. The method of claim 1, wherein a physical page comprises a smallest unit of physical space that can be read from or programmed into the NAND flash devices.

3. The method of claim 1, wherein receiving the logical page of data comprises receiving the logical page of data from an error-correcting code (ECC) encoder.

4. The method of claim 1, wherein the logical page of data includes user data and meta data corresponding to the user data, and wherein the meta data includes parity bits for error-correction of the user data.

5. The method of claim 1, wherein the logical page of data has a size greater than a physical page size.

6. The method of claim 5, wherein the logical page of data includes additional parity bits for extending an expected lifespan corresponding to the non-volatile computer storage.

7. The method of claim 1, wherein the logical page of data has a size smaller than a physical page size, and wherein a physical page in the non-volatile computer storage can be used to store data corresponding to more than one logical pages of data.

8. A system for writing data to non-volatile computer storage, comprising:
 an intermediate storage configured to receive a logical page of data and store the logical page of data;
 a processor coupled to the intermediate storage and configured to:
  read a first portion of the logical page from the intermediate storage;
  read a second portion of the logical page from the intermediate storage; and
  write the first portion of the logical page to a first physical page in the non-volatile computer storage and write the second portion of the logical page to a second physical page in the non-volatile computer storage, wherein the non-volatile computer storage includes two or more NAND flash devices, and wherein the writing of the first portion of the logical page and the writing of the second portion of the logical page are performed in parallel to two NAND flash devices; and
 a memory coupled to the processor and configured to provide the processor with instructions.

9. The system of claim 8, wherein a physical page comprises a smallest unit of physical space that can be read from or programmed into the NAND flash devices.

10. The system of claim 8, wherein the logical page of data is received from an error-correcting code (ECC) encoder.

11. The system of claim 8, wherein the logical page of data includes user data and meta data corresponding to the user data, and wherein the meta data includes parity bits for error-correction of the user data.

12. The system of claim 8, wherein the logical page of data has a size greater than a physical page size.

13. The system of claim 12, wherein the logical page of data includes additional parity bits for extending an expected lifespan corresponding to the non-volatile computer storage.

14. The system of claim 8, wherein the logical page of data has a size smaller than a physical page size, and wherein a physical page in the non-volatile computer storage can be used to store data corresponding to more than one logical pages of data.

15. A method of reading data from non-volatile computer storage, comprising:
 reading a first portion of a logical page from a first physical page in the non-volatile computer storage, reading a second portion of the logical page from a second physical page in the non-volatile computer storage, wherein the non-volatile computer storage includes two or more NAND flash devices, and wherein the reading of the first portion of the logical page and the reading of the second portion of the logical page are performed in parallel, and wherein the first portion is read from a first NAND flash device and the second portion is read from a second NAND flash device;
 writing the first portion of the logical page in an intermediate storage;
 writing the second portion of the logical page in the intermediate storage; and
 concatenating the first portion and the second portion of the logical page to form the logical page.

16. The method of claim 15, further comprising sending the concatenated logical page to an ECC decoder.

17. A system for reading data from non-volatile computer storage, comprising:
 an intermediate storage;
 a processor coupled to the intermediate storage and configured to:
  read a first portion of a logical page from a first physical page in the non-volatile computer storage, read a second portion of the logical page from a second physical page in the non-volatile computer storage, wherein the non-volatile computer storage includes two or more NAND flash devices, and wherein the reading of the first portion of the logical page and the reading of the second portion of the logical page are performed in parallel, and wherein the first portion is read from a first NAND flash device and the second portion is read from a second NAND flash device;
  write the first portion of the logical page in the intermediate storage;
  write the second portion of the logical page in the intermediate storage; and
  concatenate the first portion and the second portion of the logical page to form the logical page; and
 a memory coupled with the processor and configured to provide the processor with instructions.

18. The system of claim 17, wherein the memory is further configured to provide the processor with instructions which when executed cause the processor to send the concatenated logical page to an ECC decoder.

* * * * *